United States Patent [19]

'T Hoen

[11] Patent Number: 4,518,889

[45] Date of Patent: May 21, 1985

[54] PIEZOELECTRIC APODIZED ULTRASOUND TRANSDUCERS

[75] Inventor: Pieter J. 'T Hoen, Mission Viejo, Calif.

[73] Assignee: North American Philips Corporation, New York, N.Y.

[21] Appl. No.: 421,558

[22] Filed: Sep. 22, 1982

[51] Int. Cl.[3] ....................... H04R 17/00; H01L 41/08

[52] U.S. Cl. .................................. 310/357; 310/334; 361/233; 367/153

[58] Field of Search .................. 310/334, 337, 357, 8, 310/9, 800, 320, 358, 338; 361/233; 367/905, 153, 157

[56] References Cited

U.S. PATENT DOCUMENTS

| | | | |
|---|---|---|---|
| 2,797,399 | 6/1957 | Camp et al. | 367/163 |
| 2,928,068 | 3/1960 | Samsel et al. | 340/10 |
| 2,956,184 | 10/1960 | Pollack | 310/357 |
| 3,525,071 | 8/1970 | Massa, Jr. | 310/334 |
| 4,234,813 | 11/1980 | Iguchi et al. | 310/800 |
| 4,375,042 | 2/1983 | Marcus | 310/357 |
| 4,412,148 | 10/1983 | Klicker et al. | 310/358 |
| 4,460,841 | 7/1984 | Smith et al. | 310/334 |

FOREIGN PATENT DOCUMENTS

| | | | |
|---|---|---|---|
| 128999 | 10/1980 | Japan | 310/334 |

*Primary Examiner*—Peter S. Wong
*Assistant Examiner*—D. L. Rebsch
*Attorney, Agent, or Firm*—Jack E. Haken

[57] ABSTRACT

An ultrasound transducer for medical pulse echo applications is apodized by causing the level of response to vary as a function of position on the transducer aperture. In a preferred embodiment, the response varies as a Gaussian function of distance from the center or centerline of the transducer so that the response at the edge of the transducer is approximately 30% of the response at the center or centerline. The response may be varied by causing the polarization of a piezoelectric ceramic transducer to decrease as a function of distance from the acoustic axis. In a preferred embodiment the transducer comprises a matrix of parallel rods of piezoelectric ceramic in an inert binder. The polarization of the piezoelectric body may be controlled by locally polarizing regions of the transducer with different voltages or for different periods of time. A polarization profile may also be produced by selectively heating localized regions of a previously uniformly polarized transducer to selectively depolarize them.

11 Claims, 11 Drawing Figures

PIEZOELECTRIC APODIZED ULTRASOUND TRANSDUCERS

FIELD OF INVENTION

The invention relates to piezoelectric ultrasound transducers wherein improved directivity is achieved through apodization. The invention also relates to methods for manufacturing apodized transducers. The piezoelectric transducers of the present invention are particularly useful in medical imaging applications.

BACKGROUND OF THE INVENTION

Echo ultrasound is a popular modality for imaging structures within the human body. One or more ultrasound transducers are utilized to project ultrasound energy into the body. The energy is reflected from impedance discontinuities associated with organ boundaries and other structures within the body; the resultant echos are detected by one or more ultrasound transducers (which may be the same transducers used to transmit the energy). The detected echo signals are processed, using well known techniques, to produce images of the body structures.

The peak pressure in the emitted ultrasound beam is related to the grey-level distribution in the resultant image. The cross-section of the ultrasound beam emitted by a transducer is described by the emission directivity function which, at any distance from the transducer, is defined as the variation of peak pressure as a function of lateral distance to the beam axis. The directivity function of a transducer is used to characterize its spatial resolution as well as its sensitivity to artefacts. The main lobe width of the beam is a measure of the transducer's spatial resolution and is characterized by the full-width-at-maximum (FWHM) of the directivity function. The off-axis intensity is a measure of the sensitivity of the transducer to artefacts. The width of the emission directivity function at −25 dB (denoted FW25) is a good measure of the offaxis intensity characteristics of a transducer in a medical ultrasound imaging system. It indicates the width of the image of a single scatterer. In a typical echo system, the −25 dB level for emission corresponds to about the preferred 50 dB dynamic range of the image.

The directivity function of a transducer is related to its aperture function (which is the geometric distribution of energy across the aperture of the transducer). The prior art has recognized that, in narrowband systems, the far-field directivity function corresponds to the Fourier transform of the aperture function; this relationship has been applied for beam-shaping in radar and sonar systems. This relationship does not hold true, however, in medical ultrasound systems which utilize a short pulse, and thus a broad frequency spectrum, and which usually operate in the near-field of the transducer. Therefore, in medical ultrasound applications the directivity function of a transducer must be rigorously calculated or measured for each combination of transducer geometry and aperture function. The directivity function of a transducer may, for example, be calculated on a digital computer using the approach set forth in Oberhettinger On Transient Solutions of the "Baffled Piston" Problem, J. of Res. Nat. Bur. Standards-B 65B (1961) 1–6 and in Stepanishen Transient Radiation from Pistons in an Infinite Planar Baffle, J. Acoust. Soc. Am. 49 (1971) 1629–1638. One applies a convolution of the velocity impulse response of the transducer with the electrical excitation and with the emission impulse response of the transducer.

A transducer may be apodized, that is: its off-axis intensity characteristics can be improved, by shaping the distribution of energy applied across the transducer to a desired aperture function. For a single disc, piezoelectric transducer, this has been accomplished by shaping the applied electric field through use of different electrode geometries on opposite sides of the disc as described, for example, in Martin and Breazeale A Simple Way to Eliminate Diffraction Lobes Emitted by Ultrasonic Transducers, J. Acoust. Soc. Am. 49 No. 5 (1971) 1668, 1669 or by applying different levels of electrical excitation to adjacent transducer elements in an array. However the method of Martin and Breazeale is limited to a number of simple aperture functions and the use of separate surface electrodes requires complex transducer geometries and switching circuits.

SUMMARY OF THE INVENTION

In accordance with the invention, a piezoelectric ultrasound transducer is apodized by varying the polarization of the piezoelectric material as a function of position on the active surface of the transducer. A transducer element may, for example, be provided with apodization by causing the polarization to decrease as a function of distance from a line or point at the center of the active face of the transducer.

In a preferred embodiment of the invention the transducer comprises an array of substantially rectangular transducer elements distributed along a central line. The transducer is cylindrically apodized by causing the polarization of the piezoelectric material to decrease as a function of distance from the central line.

The piezoelectric material may comprise a solid homogeneous plate of piezoelectric ceramic or may, alternately, comprise a matrix of parallel rods of piezoelectric ceramic distributed in an electrically inert binding material. This composite construction reduces coupling between adjacent regions on the face of the transducer and reduces a tendency to form shear waves in the apodized transducer.

In a preferred embodiment, the polarization of the piezoelectric material varies as a Gaussian function with distance from a central point or line on the transducer face so that, when uniform electrical excitation is applied across the transducer, the mechanical response of the active surface of the transducer decreases as a Gaussian function of distance from the central point or line and the response at edges of the transducer is approximately 30% of the response at the central point or line (Hereafter referred to as a 30% Gaussian apodization).

Transducers of the present invention can be manufactured by applying a pattern of temporary electrodes on the transducer surface and subjecting the various underlying regions to different values of polarizing voltage. Alternately, the polarization of the underlying regions may be varied by applying a constant voltage to the electrodes for varying periods of time. A specially shaped body of material with appropriate electrical properties may be applied to the transducer face in series with the polarizing voltage in order to produce a smoothly varying polarization distribution across a region of the transducer.

In an alternate process for manufacturing apodized transducers, a plate of piezoelectric material is uniformly polarized. The uniformly polarized material is then selectively depolarized, for example by applying heat to the edges of the plate to produce a desired polarization distribution.

If the piezoelectric material is constructed with a matrix of piezoelectric ceramic rods in an inert binder, a polarization distribution may be achieved by separately contacting and polarizing each of the individual rods with a different voltage or for a different period of time. Alternately, the composition of the piezoelectric ceramic rods may be varied as a function of their position in the transducer in order to achieve a polarization distribution. Likewise, the diameter of the individual rods or the spacing between individual rods may be varied as a function of position on the transducer element in order to achieve a net polarization distribution.

DESCRIPTION OF THE PREFERRED EMBODIMENTS

Figure 1:
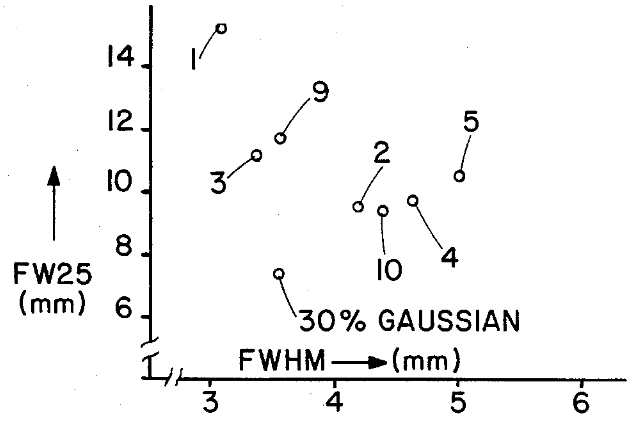
FIG. 1 is a plot which characterizes the directivity functions of transducers with various aperture functions.

Transducers for medical ultrasound applications are generally constructed from a plate of piezoelectric ceramic material. The plate may comprise a single transducer element or it may, alternately comprise an array of elemental transducers in conjunction with an electrode structure which allows application of different electric signals to individual the transducer elements or groups of elements. Acoustic energy is primarily emitted from and received by the transducer at an active surface of the plate and along an acoustic axis. The acoustic axis of a single element transducer usually passes through the center of the active surface and is substantially perpendicular thereto. Signal phasing techniques are known which allow the acoustic axis of an array of transducer elements to assume different angles with the surface of the plate and permit electrical steering of the acoustic axis. The location of the point of intersection of the acoustic axis with the active surface may also be shifed by switchably connecting or disconnecting transducer elements in an array.

As used herein and in the claims which follow, a "phased array" transducer is a transducer which is constructed and operated in a manner which allows the angle between the acoustic axis and the surface of the plate to assume values other than approximately 90° but which maintains a fixed point of intersection of the axis with the surface; a "stepped array" transducer is a transducer which is constructed and operated in a manner which allows the point of intersection of the acoustic axis to shift on the active surface and a "linear stepped array" transducer is a transducer which is constructed and operated in a manner which allows the point of intersection of the acoustic axis to shift only along a centerline on the active surface.

The piezoelectric material is polarized in a direction which is substantially perpendicular to the active surface of the plate. The plate may be curved to provide mechanical focusing of the beam at a selected distance along the acoustic axis from the active face. Alternately, elemental regions on the active face may be separately excited with appropriate signal delays so that constructive interference of the emitted beams occurs at a selected focal distance on the acoustic axis. The transducer will, however, also produce off-axis radiation in a geometry which is primarily determined by the aperture function of the transducer.

It is known that off-axis radiation of the transducer may be reduced if the transducer aperture is apodized, that is: the excitation of the transducer is reduced as a function of distance from the acoustic axis. Apodization tends to improve off-axis directivity but decreases spatial resolution. Thus a properly apodized transducer will exhibit a smaller FW25 but a larger FWHM than a transducer which is not apodized. The prior art has recognized that the far-field of a transducer operating in a narrow band, continuous-wave mode may be optimally apodized with a Chebyshev polynominial function. However, ultrasound transducers used for medical imaging purposes are generally excited with a short, wideband pulse (typically a single cycle at the resonant frequency of the transducer).

A transducer in which apodization results in the best possible tradeoff between spatial resolution and off-axis directivity may be defined as an optimum transducer aperture for medical ultrasound imaging. FIG. 1 is a plot of the spatial resolution and off-axis directivity performance of a linear array of transducer elements with various aperture function apodizations. The spatial resolution of the transducer is represented by FWHM on the horizontal axis while the off-axis directivity is represented by FW25 on the vertical axis. Transducers with characteristics lying close to the origin are better suited for medical ultrasound applications than transducers whose characteristics are further away from the origin. Point 1 indicates the characteristics of a rectangular (unapodized) aperture function. This transducer has a narrow spatial resolution and rather poor off-axis directivity. Points 2 through 11 illustrate the performance of previously published apodizations and represent, respectively, a cosine apodization 2, a 50% Gaussian apodization 3, a Hamming apodization 4, a Hanning apodization 5, a semi-circular apodization 9, and a 10% Gaussian apodization 10.

In accordance with the present invention, I have determined that a 30% Gaussian apodization has a substantially better combination of spatial resolution and off-axis directivity characteristics than any of the previously published aperture functions for medical ultrasound applications. As illustrated in FIG. 1 the characteristics of the transducer with a 30% Gaussian apodization lie substantially closer to the origin than the characteristics of any of the other transducers.

Figure 2:
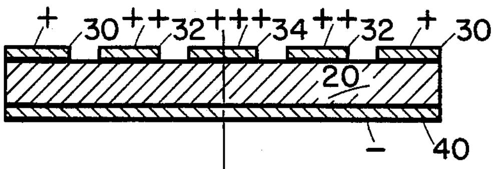
FIGS. 2 and 3 schematically illustrate a method for manufacturing an apodized disc transducer.
Figure 3:
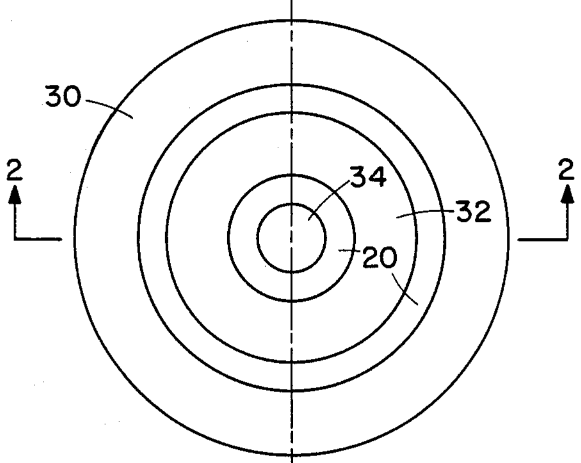
Figure 4:
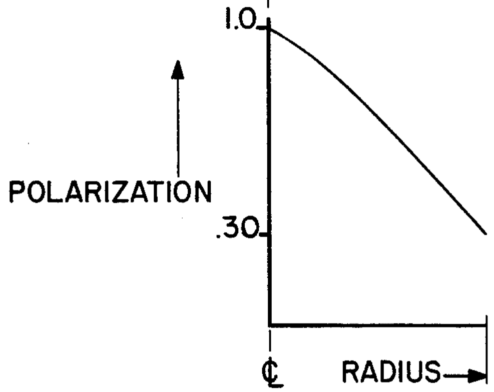
FIG. 4 is a plot of the relative polarization at corresponding locations in the disc transducer of FIGS. 2 and 3.

In accordance with the present invention an apodized piezoelectric transducer may be manufactured by causing the polarization of a piezoelectric ceramic plate to vary as a function of distance from a central axis of the transducer. Transducers are polarized during manufacture by applying a relatively high D.C. voltage across the ceramic for a predetermined period of time. The polarization of the ceramic material varies directly with the strength of the applied electric field and the time during which the field is applied. FIGS. 2 and 3 illustrate a method for apodizing a disc transducer by providing a polarization profile which decreases toward the edges of the disc. A series of annular electrodes 30, 32 and 34 are applied to one surface of a disc 20 of unpolarized piezoelectric ceramic material. A single flat electrode 40 is provided on the second surface of the disc. The disc is polarized by applying different voltages to each of the concentric electrodes, the highest voltage being applied to electrode 34 at the center and progressively lower voltages being applied to the electrodes 32, and 30 towards the edge of the disc. The values of the voltages are selected to achieve a stepwise approximation of the selected apodization profile which, optimally, should be a 30% Gaussian function. FIGS. 2 and 3 are illustrated with three annular electrodes for the sake of clarity, but in actual practice a larger number of electrodes should be used to achieve a relatively smooth approximation of the desired function. FIG. 4 indicates the desired relative polarization of the ceramic for corresponding radii. The electrodes 30, 32, 34 and 40 may later be utilized to excite the transducer. Alternately, they may be removed and a different electrode geometry may be used to excite the transducer.

In an alternate embodiment of the invention illustrated in FIGS. 2 through 4 the same voltage may be applied to all of the concentric electrodes and the time of application to individual electrodes adjusted to achieve the desired polarization distribution. A combination of varying polarization voltages and times may also be used to achieve a desired profile.

Figure 5:
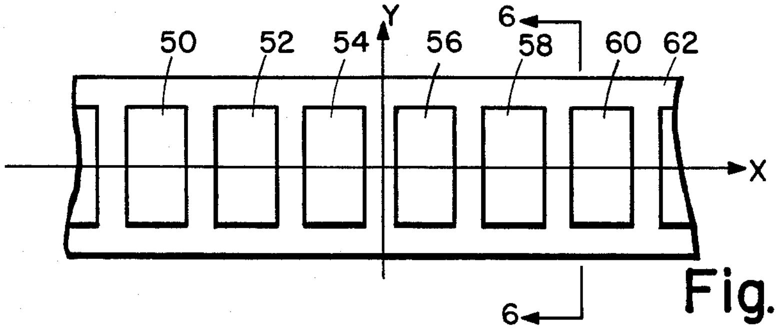
FIG. 5 is a transducer which comprises a linear array of transducer elements.
Figure 6:
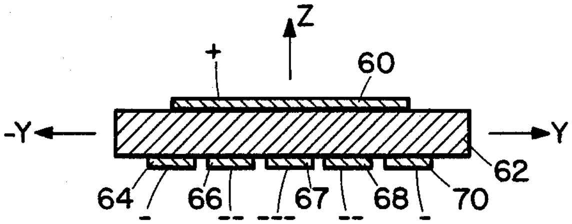
FIG. 6 illustrates a method for apodizing the transducer of FIG. 5.

The apodization techniques of the present invention may be applied to an ultrasound transducer which includes an array of individual transducer elements. FIGS. 5 and 6 illustrate a rectangular transducer array which comprises six transducer electrodes 50 through 60 etc. disposed in a line on the surface of a plate 62 of piezoelectric ceramic material 62. The region of the plate under each of the electrodes 50 through 60 defines a transducer element. Electrical signals from the electrodes 50 through 60 are typically combined through delay circuits, using techniques well-known in the art, to achieve an ultrasound beam which is focused at a given distance along the acoustic axis z of the transducer. Signals may also be sequentially connected and/or disconnected at individual elements to produce a linear stepped array transducer and/or delayed to steer the acoustic axis of the beam in the x-z plane. The prior art also teaches that the relative strengths of signals applied to and received from the electrodes may be varied to achieve a step-wise approximation of an apodized aperture function in order to reduce the off-axis directivity function of the transducer in the x-z plane.

Figure 8:
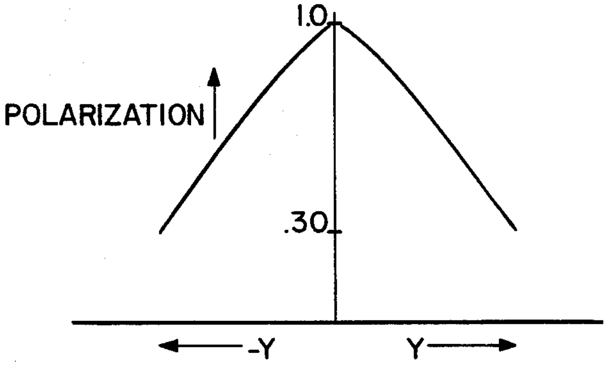
FIG. 8 illustrates the relative polarization of materials at corresponding locations in FIG. 5.

In accordance with the present invention, the retangular array transducer may also be apodized parallel to the y axis, transverse to the centerline of the array, in order to reduce off-axis directivity in the y-z plane. This cylindrical apodization is achieved by causing the polarization of the ceramic plate 62 to decrease as a function of distance from the x axis (the centerline of the array). This cylindrical polarization distribution may be obtained by providing a series of temporary electrodes 64 through 70 on the bottom surface of the array. The electrodes 50 through 60 on the top surface of the plate are connected to a common terminal and varying polarization is achieved by applying a voltage profile across the electrodes 64 through 70 or by varying the polarization time as indicated with respect to the single transducer element of FIGS. 2 and 3. The polarization profile of FIG. 8, which corresponds to locations in the cross-sectional view of FIG. 6, is thus achieved. The surface of the plate may be curved to focus the individual elements. Alternately, a mechanical lens may be applied over the active surface to focus the beam in the y-z plane.

In a phased array transducer the polarization of the plate may also decrease as a function of distance from the y axis in order to improve off-axis directivity in the x-z plane. This two dimensional polarization apodization is not suitable, however, for use in stepped array transducers where connections to individual transducer elements are switched in order to shift the origin of the acoustic axis along the x axis.

Figure 7:
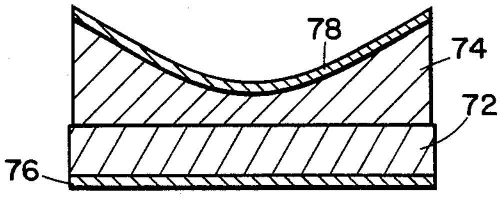
FIG. 7 illustrates another method for apodizing the transducer of FIG. 5.

FIG. 7 illustrates an alternate method for producing a polarization distribution across a plate of piezoelectric ceramic material. The plate of piezoelectric material 72 is clamped between a block of material having electrical properties (i.e. resistivity and dielectric constant) which form a voltage divider with the piezoelectric plate 74. A first electrode 78 is provided on the surface of the block opposite the surface which contacts the piezoelectric plate and a second electrode 76 is provided on the back of the plate. The upper surface of the block is profiled so that the desired voltage distribution is produced across the width of the piezoelectric plate. The plate is then polarized by applying a voltage between the electrodes 76 and 78 for a sufficient period of time to polarize the piezoelectric material.

Figure 9:
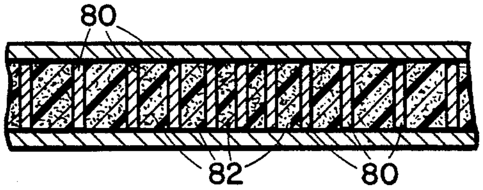
FIGS. 9 and 9A schematically illustrate apodized transducers which comprise a matrix of piezoelectric rods in an inert binder.

The prior art teaches that a piezoelectric transducer may also be fabricated from a composite material which comprises a matrix of piezoelectric ceramic in an electrically inert resin binder (See, for example, Newham, Bowen, Klicker & Cross, Composite Piezoelectric Tranducers (Review), International Engineer. Applic. 11 #2, 93–106 1980, which is incorporated herein, by reference, as background material). FIG. 9 illustrates a transducer fabricated from a composite material which comprises parallel rods 80 of piezoelectric ceramic which are aligned with the acoustic axis of the transducer and which are embedded in and separated by an inert resin binder 82, which may for example be epoxy. A composite piezoelectric body of this type is particularly suitable for use in an apodized transducer. The resin binder provides a relatively low mechanical coupling between the localized regions of the transducer which are associated with the individual rods and discourages the formation of shear waves which might otherwise be formed when varying levels of excitation are applied to adjacent regions of the transducer.

A polarization distribution may be produced in a composite transducer of this type by polarizing the individual rods with different voltages or for different periods of time using the methods described above with respect to FIGS. 6 and 7. Alternately, the composition of the piezoelectric ceramic in individual rods or groups of rods may be varied as a function of position in the transducer in order to produce a polarization distribution.

Figure 9A:
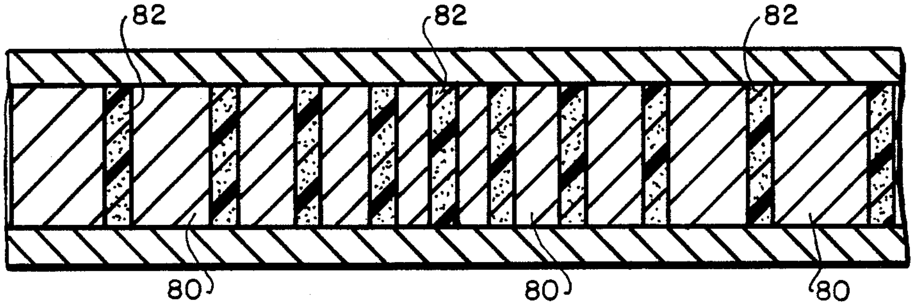

Likewise, the cross-section of individual rods 80 in the binder 82 (as illustrated in FIG. 9A) or the spacing between rods (as illustrated in FIG. 9) may vary as a function of position from a central point or line on the transducer to produce a net polarization distribution across the transducer aperture.

Figure 10:
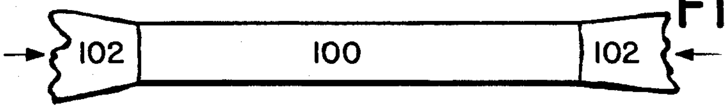
FIG. 10 illustrates an alternate method for creating a polarization profile in a transducer.

FIG. 10 illustrates a further method for producing a polarization distribution across a transducer aperture. A plate of piezoelectric ceramic 100 is uniformly polarized using any of the methods of the prior art. Heat is then applied to the edges of the plate, for example by clamping the sheet between heated blocks 102 to selectively depolarize material from the edges of the plate. The extent and distribution of the depolarizaton can be regulated by controlling the temperature and duration of the applied heat.

I claim:

1. An apodized ultrasound transducer comprising a body of piezoelectric material which is polarized in a direction substantially perpendicular to a surface of the body and wherein the polarization decreases as a function of distance from a central line or point on the surface, wherein, as an improvement, the polarization of the material decreases so that the acoustic response of the active surface of the transducer to a uniform electrical excitation decreases as a Gaussian function of distance from the point or line and the response at the edges of the surface is approximately 30% of the response at the point or line.

2. An apodized ultrasound transducer comprising a body of piezoelectric material which is polarized in a direction which is substantially parallel to a central acoustic axis and means for exciting the piezoelectric material so that the acoustic response of an active surface of the transducer decreases as a Gaussian function of distance from the acoustic axis and the response at edges of the surface is approximately 30% of the response at the acoustic axis.

3. The transducer of claim 1 wherein the body comprises a plate of piezoelectric material having two major surfaces, wherein an acoustic axis passes through the center of one of the major surfaces and the polarization decreases as a function of distance from the point of intersection of the axis and said surface.

4. The transducer of claim 3 wherein the body of piezoelectric material is a substantially flat disc.

5. An apodized ultrasound transducer comprising a body of piezoelectric material which is polarized in a direction substantially perpendicular to a surface of the body and wherein the polarization decreases as a function of distance from a central line or point on the surface wherein, as an improvement, the body comprises a matrix of substantially parallel rods of piezoelectric ceramic which are embedded in and isolated from one another by an electrically inert binder and are polarized in a direction parallel to their length and wherein the distance between the rods varies as function of the distance from the center line or point.

6. An apodized ultrasound transducer comprising a body of piezoelectric material which is polarized in a direction substantially perpendicular to a surface of the body and wherein the polarization decreases as a function of distance from a central line or point on the surface wherein, as an improvement, the body comprises a matrix of substantially parallel rods of piezoelectric ceramic which are embedded in and isolated from one another by an electrically inert binder and are polarized in a direction parallel to their length and wherein the composition of the rods varies as a function of distance from the line or point.

7. An apodized ultrasound transducer comprising a body of piezoelectric material which is polarized in a direction substantially perpendicular to a surface of the body and wherein the polarization decreases as a function of distance from a central line or point on the surface wherein, as an improvement, the body comprises a matrix of substantially parallel rods of piezoelectric ceramic which are embedded in and isolated from one another by an electrically inert binder and are polarized in a direction parallel to their length and wherein the cross section of the individual rods varies as a function of distance from the line or point.

8. An ultrasound transducer comprising:

a plate of piezoelectric material which is polarized in a direction substantially perpendicular to a surface thereof and which includes a matrix of rods of piezoelectric ceramic embedded in and isolated from one another by an electrically inert binder, the rods being aligned perpendicular to the surface of the plate;

a plurality of adjacent electrodes disposed on a central line on the surface of the plate, the area of the plate underlying each of the electrodes defining a separate transducer element;

wherein the degree of polarization of the piezoelectric material decreases as a function of distance on the surface from the central line so that the acoustic response of the active surface of the transducer to a uniform electrical excitation decreases as a Gaussian function of distance from the line and the response at the edges of the surface is approximately 30% of the response at the line.

9. The transducer of claim 8 wherein the distance between the rods varies as a function of the distance from the centerline.

10. The transducer of claim 8 wherein the transducer is a phased array transducer and wherein the degree of polarization also decreases in a direction parallel to the centerline as a function of distance from the point of intersection of an acoustic axis with the surface of the plate.

11. The transducer of claim 1 wherein the means for exciting includes means for applying a short, wide band electrical pulse across the piezoelectric material.

* * * * *